United States Patent
Bayerer

(10) Patent No.: US 10,462,921 B2
(45) Date of Patent: Oct. 29, 2019

(54) METHOD FOR PRODUCING AN ELECTRONIC MODULE ASSEMBLY AND ELECTRONIC MODULE ASSEMBLY

(71) Applicant: Infineon Technologies AG, Neubiberg (DE)

(72) Inventor: Reinhold Bayerer, Reichelsheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/852,158

(22) Filed: Dec. 22, 2017

(65) Prior Publication Data

US 2018/0184538 A1 Jun. 28, 2018

(30) Foreign Application Priority Data

Dec. 23, 2016 (EP) .................................... 16206797

(51) Int. Cl.
*H05K 7/00* (2006.01)
*H05K 1/00* (2006.01)
(Continued)

(52) U.S. Cl.
CPC ............... *H05K 7/14* (2013.01); *H01L 23/10* (2013.01); *H01L 23/16* (2013.01); *H01L 23/24* (2013.01);
(Continued)

(58) Field of Classification Search
CPC .. H05K 7/00; H05K 7/10; H05K 7/14; H05K 7/20; H05K 7/203; H05K 7/203; H05K 7/2039; H05K 1/00; H05K 1/02; H05K 1/02; H05K 1/0203; H05K 1/0209; H05K 1/10; H05K 1/18; H05K 5/00; H05K 5/02; H05K 5/02; H05K 5/023; H05K 5/203; H05K 5/2039; H01L 23/00; H01L 23/10; H01L 23/16; H01L 23/30; H01L 23/37; H01L 23/37; H01L 23/373; H01L 23/373; H01L 23/3735
See application file for complete search history.

(56) References Cited

U.S. PATENT DOCUMENTS

2015/0115282 A1 4/2015 Takahashi et al.
2016/0120039 A1* 4/2016 Bang ...................... H01L 23/36
29/832

(Continued)

FOREIGN PATENT DOCUMENTS

CN 205452265 U 8/2016
JP 2003303933 A 10/2003

*Primary Examiner* — Jacob T Minskey
*Assistant Examiner* — Matthew Hoover
(74) *Attorney, Agent, or Firm* — Murphy, Bilak & Homiller, PLLC

(57) ABSTRACT

One aspect relates to a method for producing an electronic module assembly. According to the method, a curable first mass extending between a substrate assembly and a module housing is cured while a circuit carrier of the substrate assembly has at least a first temperature. Between a side wall of the module housing and the substrate assembly, an adhesive connection is formed by curing a curable second mass. Subsequent to curing the first mass, the circuit carrier is cooled down to below a second temperature lower than the first temperature. Embodiments of the electronic module assembly are also described.

19 Claims, 6 Drawing Sheets

(51) Int. Cl.
    *H05K 5/00*     (2006.01)
    *H01L 23/00*     (2006.01)
    *H05K 7/14*     (2006.01)
    *H05K 1/02*     (2006.01)
    *H05K 1/18*     (2006.01)
    *H05K 5/02*     (2006.01)
    *H05K 7/20*     (2006.01)
    *H01L 23/10*     (2006.01)
    *H01L 23/16*     (2006.01)
    *H01L 23/373*     (2006.01)
    *H01L 23/24*     (2006.01)
    *H05K 3/28*     (2006.01)
    *H01L 23/40*     (2006.01)
    *H01L 23/053*     (2006.01)

(52) U.S. Cl.
    CPC ....... *H01L 23/3735* (2013.01); *H05K 1/0203* (2013.01); *H05K 1/0209* (2013.01); *H05K 1/18* (2013.01); *H05K 5/0239* (2013.01); *H05K 7/2039* (2013.01); *H01L 23/053* (2013.01); *H01L 23/4006* (2013.01); *H01L 2224/48091* (2013.01); *H01L 2224/48227* (2013.01); *H01L 2924/181* (2013.01); *H01L 2924/3511* (2013.01); *H05K 1/0271* (2013.01); *H05K 3/284* (2013.01); *H05K 2201/0162* (2013.01); *H05K 2201/066* (2013.01); *H05K 2201/09018* (2013.01); *H05K 2201/09136* (2013.01); *H05K 2201/10409* (2013.01); *H05K 2201/10598* (2013.01); *H05K 2201/2018* (2013.01); *H05K 2203/1105* (2013.01); *H05K 2203/302* (2013.01)

(56) References Cited

U.S. PATENT DOCUMENTS

2016/0233141 A1*   8/2016   Hirobe ................ H01L 23/3675
2017/0064808 A1*   3/2017   Rizza ..................... H01L 23/24

* cited by examiner

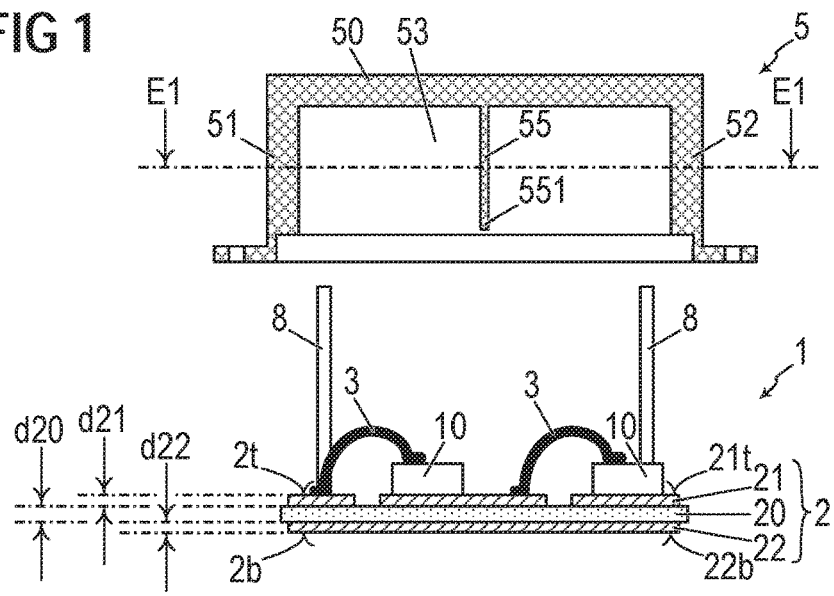
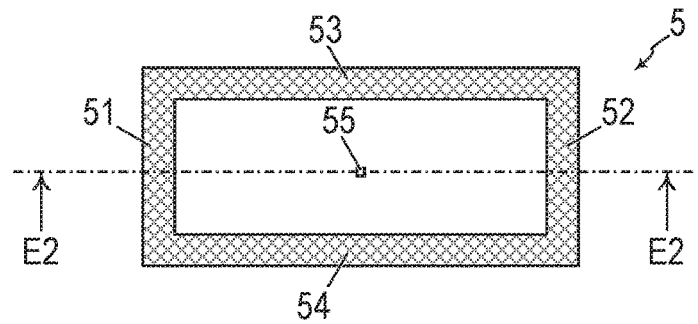
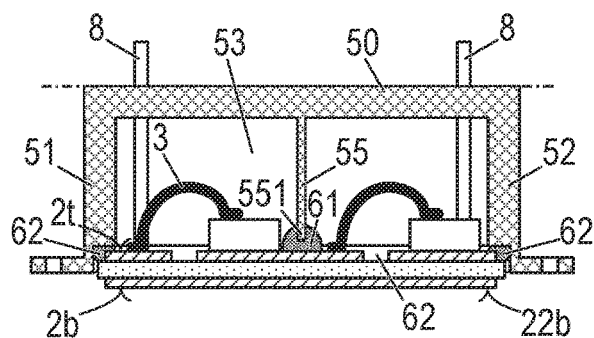
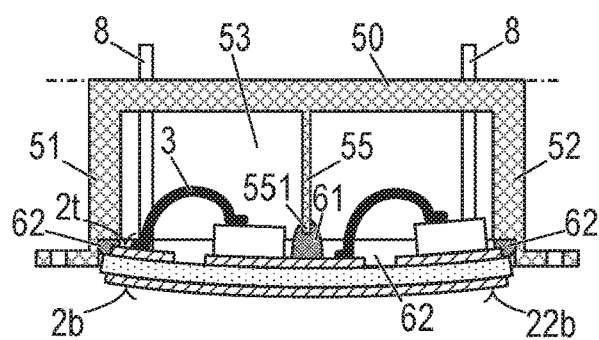

METHOD FOR PRODUCING AN ELECTRONIC MODULE ASSEMBLY AND ELECTRONIC MODULE ASSEMBLY

BACKGROUND

Electronic modules frequently include a circuit carrier carrying one or more electronic components, e.g. one or more semiconductor chips, each having an integrated semiconductor switch. For instance, such an electronic module may include an inverter, a power supply for supplying an inductive load like a motor, or any other power electronic circuit. The circuit carrier serves to carry and electrically interconnect the electronic components. In order to dissipate heat produced by power losses in the electronic components, or, more generally, in an electronic circuit realized on the circuit carrier, the electronic module may be pressed against a heat sink. An exterior heat exchange surface of the module with a layer of thermal interface material (e.g. a thermal grease, phase change materials etc.) is disposed between the heat sink and the module's heat exchange surface so that a significant part of the heat can flow from the electronic components via the circuit carrier and the layer of thermal interface material towards the heat sink.

The thermal interface material serves to eliminate large air gaps or other gas-filled voids (which act as thermal insulator) from the interface area between the heat exchange surface and the heat sink so as to maximize the heat transfer. The thermal conductivity of conventional thermal interface material (e.g. from 0.4 W/(m·K) to 1 W/(m·K) at a temperature of 25° C.) is greater than the thermal conductivity of the air/gas in the gas-filled spaces, but poor compared to the thermal conductivity of conventional heat sinks. For instance, many conventional heat sinks are produced from aluminum or an aluminum alloy and have, depending on the purity or alloy composition, a thermal conductivity of up to 236 W/(m·K). Therefore, it is desirable to keep the layer of thermal interface material as thin as possible.

However, a real heat exchange surface is uneven or becomes uneven during the assembly of the electronic module so that one or more "remote" sections of the heat exchange surface are disposed more distant from the heat sink than other sections. Irrespective of whether or not the space between the heat sink and a remote section is filled with thermal interface material or not, the comparatively large distance between the remote section and the heat sink increases the thermal transition resistance between the heat exchange surface and the heat sink.

Hence, there is a general need for an electronic module assembly that allows for a low thickness of a thermal interface material between an electronic module and a heatsink.

SUMMARY

One aspect relates to a method for producing an electronic module assembly. In that method, a curable first mass extending between a substrate assembly and a module housing is cured while a circuit carrier of the substrate assembly has at least a first temperature. Between a side wall of the module housing and the substrate assembly, an adhesive connection is formed by curing a curable second mass. Subsequent to curing the first mass, the circuit carrier is cooled down to below a second temperature lower than the first temperature.

A further aspect relates to an electronic module assembly. The electronic module assembly includes a substrate assembly, a module housing, a cured first mass extending between the substrate assembly and the module housing, and a heat exchange surface formed by a surface of the circuit carrier facing away from the cured first mass. If the electronic module assembly is heated to an overall temperature at least a first temperature, a point of the heat exchange surface opposite the cured first mass has a first distance from a lid of the module housing, and if the electronic module assembly is cooled to an overall temperature of less than or equal to a second temperature lower than the first temperature, the point of the heat exchange surface has a second distance from the lid of the module housing. The first distance is greater than the second distance, and the circuit carrier is, at least in a region of the heat exchange surface opposite the cured first mass, convex.

Those skilled in the art will recognize additional features and advantages upon reading the following detailed description, and upon viewing the accompanying drawings.

BRIEF DESCRIPTION OF THE DRAWINGS

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

FIG. 1 is a vertical cross-sectional view illustrating a substrate assembly and a module housing having a plunger.

FIG. 2 is a horizontal cross-sectional view illustrating a cross-section of the module housing of FIG. 1 in a cross-sectional plane E1-E1.

FIGS. 3A to 3F illustrate different steps of a process in which an electronic module assembly is produced by joining the substrate assembly and the module housing.

DETAILED DESCRIPTION

Figure 3C:
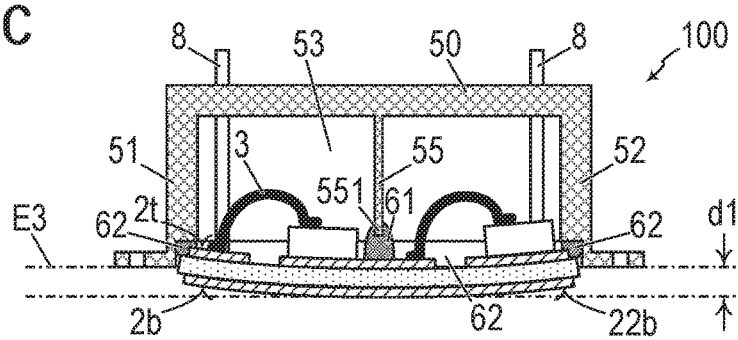

In the following detailed description, reference is made to the accompanying drawings. The drawings show specific examples in which the invention may be practiced. It is to be understood that the features and principles described with respect to the various examples may be combined with each other, unless specifically noted otherwise.

FIG. 1 schematically illustrates a substrate assembly 1 and a module housing 5. The substrate assembly 1 includes a circuit carrier 2 (also referred to as "substrate") with a first surface 2t and a second surface 2b opposite the first surface 2t. FIG. 2. illustrates a cross-section of the module housing of FIG. 1 in a cross-sectional plane E1-E1. The cross-section of the module housing 5 of FIG. 1 is taken in a cross-sectional plane E2-E2. In the completed electronic module assembly, the second surface 2b or a section of the second surface 2b may serve as a heat exchange surface at which the electronic module assembly can be attached on a heat sink.

The circuit carrier 2 may have a dielectric insulation carrier 20, a first substrate metallization layer 21 disposed on a first surface of the insulation carrier 20 and, optionally, a second substrate metallization layer 22 disposed on a second surface of the insulation carrier 20. If there is a second substrate metallization layer 22, the first substrate metallization layer 21 and the second substrate metallization layer 22 may be disposed on opposite sides of the insulation carrier 20.

For instance, a circuit carrier 2 may be a printed circuit board (PCB) or an IMS (insulated metal substrate). According to one example, the circuit carrier 2 may be a ceramic substrate in which the dielectric insulation carrier 20 is a ceramic, for instance a thin ceramic layer. The ceramic may be, for example, composed of or include aluminum oxide (Al2O3), aluminum nitride (AlN), zirconium oxide (ZrO2), silicon nitride, boron nitride, or any other dielectric ceramic. A circuit carrier 2 having a ceramic dielectric insulation carrier may be, without being restricted to, a DCB substrate (DCB=Direct Copper Bonding), a DAB substrate (DAB=Direct Aluminum Bonding), an AMB substrate (AMB=Active Metal Brazing) or an IMS substrate (IMS=Insulated Metal Substrate).

At least one of the first substrate metallization layer 21 and (if provided) second substrate metallization layer 22 may each have, independently of one another, a layer thickness d21 and d22, respectively, in the range of 0.05 mm to 2.5 mm, and the insulation carrier 20 may have, e.g., a layer thickness d20 in the range of 0.1 mm to 2 mm. For instance, each of the layer thicknesses of d21 and d22 may be, without being restricted to, from 0.2 mm to 1.2 mm, and/or d21 may be equal to d22. The layer thickness d20 of the insulation carrier 20 may be, without being restricted to, from 0.2 mm to 1 mm. However, layer thicknesses that are larger or smaller than those indicated are equally possible.

Metals with good electrical conductivity such as, for example, copper or copper alloys, aluminum or aluminum alloys are suitable as materials for the relevant first substrate metallization layer 21 and second substrate metallization layer 22. At least one of the first substrate metallization layer 21 and (if provided) second substrate metallization layer 22 may be provided in the form of pre-fabricated metal foils and attached to the insulation carrier 20. As illustrated in FIG. 1, the first substrate metallization layer 21 may be structured to build a circuit pattern.

At least one semiconductor chip 10, which may be a constituent part of the substrate assembly 1, may be disposed on a first surface 21t of the first substrate metallization layer 21. The first surface 21t of the first substrate metallization layer 21 is part of a first surface 2t of the circuit carrier 2. A second surface 22b of the second substrate metallization layer 22 (if provided) facing away from the dielectric insulation carrier 20 is part of a second surface 2b of the circuit carrier 2. Optionally, the second surface 22b or a section of the second surface 22b may form the heat exchange surface of the completed electronic module assembly.

The semiconductor chip 10 may be joined with the first substrate metallization layer 21 using a connection layer (not shown), e.g. solder layer, a layer that includes a sintered metal powder, or an adhesive layer. A semiconductor chip 10 may include a semiconductor device that has, e.g., a load path formed between a first and a second chip metallization (not shown). The semiconductor device may be, for instance, a diode, or a controllable semiconductor device like a unipolar or bipolar transistor, or a thyristor. In case of a transistor, the controllable semiconductor device may be, for instance, a MOSFET (Metal Oxide Semiconductor Field-Effect Transistor), an IGBT (insulated Gate Bipolar Transistor), a HEMT (High Electron Mobility Transistor), or any other transistor. In one example, the semiconductor device, e.g. one of the semiconductor devices mentioned above, may optionally be a vertical semiconductor device.

Optionally, the substrate assembly 1 may include at least one bonding wire 3 directly wire bonded to at least one of a semiconductor chip 10 and the first surface 2t of the first substrate metallization layer 21.

The module housing 5 includes a side wall which may include a first side wall segment 51, a second side wall segment 52, a third side wall segment 53 and a fourth side wall segment 54. The first side wall segment 51 and the second side wall segment 52 may form opposite outer wall segments of the module housing 5, and the third side wall segment 53 and the fourth side wall segment 54 may also form opposite outer wall segments of the module housing 5. In this connection, an "outer wall segment" is accessible from outside the module housing 5, i.e. from the environment of the module housing 5. As illustrated in FIG. 2, the side wall may be ring-shaped and, e.g., formed as a substantially rectangular ring. However, any ring shape, e.g. a circular ring, would work as well. Optionally, the module housing 5 may include a lid 50. If it is desired to provide for an electrical insulation of the electronic module assembly 100 to be produced, the module housing 5 may be a dielectric housing, for instance, a plastic housing (e.g. thermosetting housing or a thermoplastic housing), or a ceramic housing.

As illustrated in FIG. 1, the module housing 5 may include a plunger 55 having an end 551. The plunger may be part of the lid 50. The end 551 may be a free end. The plunger 55 or at least its end 551 may be disposed between and distant from the side wall and, therefore, from the side wall segments 51, 52, 53, 54. If the side wall includes a first side wall segment 51 and an opposite second side wall segment 52, the plunger 55 or at least its end 551 may be disposed between and distant from the first side wall segment 51 and the second side wall segment 52, and if the side wall includes a third side wall segment 53 and an opposite fourth side wall segment 54, the plunger 55 or at least its end 551 may be disposed between and distant from the third side wall segment 53 and the fourth side wall segment 54. If the module housing 5 has a lid 50, the plunger 55 may be a protrusion of the lid 50. Optionally, the lid 50 and the side wall may be made of one piece.

The electronic module includes electrical terminals 8 accessible from outside of the electronic module. Such terminals 8 may serve to provide electrical power to the module, to connect an electric load to be driven by the module, to provide a control signal for controlling the switching behavior to the module, or to tap any status signal (e.g. a signal indicative of a temperature of a semiconductor chip 10, a signal indicative of an overvoltage condition, a signal indicative of a short circuit detection, etc.). As illustrated in FIGS. 1 and 3C, the terminals 8 of the completed electronic module may be part of the substrate assembly 1 (see FIG. 1) and pierce the lid 50 (see FIG. 3C). However, this is only an example. According to a further example, the terminals 8 could be joined with the module housing 5, e.g. be injection molded into the module housing 5, and be electrically connected to the substrate assembly 1 using bonding wires. However, any other technique for providing terminals 8 may be used as well.

During the production of the electronic module assembly, a curable first mass 61 and a curable second mass 62 are used. The uncured first mass 61 (e.g. a droplet) is introduced between the substrate assembly 1 and the module housing 5 (e.g. the plunger 55 or the end 551) so that it extends from the module housing 5 (e.g. the plunger or the end 551) to the substrate assembly 1. Optionally, the uncured first mass 61 may be applied to the substrate assembly 1 prior to placing the module housing 5 onto the substrate assembly 1. The uncured second mass 62 is an adhesive used for joining the module housing 5 and the substrate assembly 1. The uncured second mass 62 is introduced between the side wall 51, 52, 53, 54 and the substrate assembly 1 (e.g. the circuit carrier 2) so that it extends from the side wall 51, 52, 53, 54 to the substrate assembly 1 (e.g. the circuit carrier 2). Thereby, the second mass 62 may be disposed distant from the first mass 61. This state is illustrated in FIG. 3A. Suitable curable masses that can be used for at least one of the first mass 61 and the second mass 62 are, without being restricted to, adhesives, e.g. silicone adhesives, epoxy adhesives or acrylic adhesives. However, the first mass 61 may be but is not required to be an adhesive. Optionally, the uncured first mass 61 and/or the uncured second mass 62 may be thixotropic which facilitates the application of the respective uncured mass 61, 62 because it is flexible during application but remains in place after application. The compositions of the curable first mass 61 and the curable second mass 62 may be identical or different.

Subsequent to introducing the uncured first mass 61 between the substrate assembly 1 and the module housing 5 and, optionally, subsequent to introducing the uncured second mass 62 between the side wall 51, 52, 53, 54 and the substrate assembly 1 (e.g. the circuit carrier 2), the first mass 61 and, optionally, the second mass 62 are cured. The first mass 61 and the second mass 62 cure in any order. For instance, the first and second masses 61, 62 may cure substantially at the same time, or the second mass 62 may cure prior to the first mass 61. However, it is also possible that the first mass 61 cures prior to the second mass 62.

The circuit carrier 2 is heated from an initial state to a heated state so that the circuit carrier 2 is in the heated state at least at that moment at which the first mass 61 reaches its cured state. The cured state of the first mass 61 is reached as soon as the first mass 61 everywhere has a modulus of elasticity of at least 1 MPa or at least 4 MPa or at least 10 MPa or even at least 20 MPa. In the heated state of the circuit carrier 2, all over the circuit carrier 2 everywhere on and in the circuit carrier 2), the temperature is at least a first temperature $T2_1$, and the circuit carrier 2 bends, as illustrated in FIG. 3B, due to the temperature rise so that a gap (a distance) between the lid 50 (e.g. between the plunger 55) and a section of the circuit carrier 2 that is distant from the side wall 51, 52, 53, 54, appears or increases. In the heated and, therefore, bent state of the circuit carrier 2, the first mass 61 is cured while all over the circuit carrier 2, the temperature is kept at at least the first temperature $T2_1$. The cured first mass 61 serves to keep a minimum distance between the substrate assembly 1 and the module housing 5 (e.g. the plunger 55 or the end 551). In order to approximately adjust that minimum distance to a distance which would occur if the electronic module assembly would be operated without the cured first mass 61, curing the first mass 61 may take place in a state in which the temperature of the circuit carrier 2 is closer to its maximum operating temperature which is significantly higher than room temperature.

Without being restricted to, the duration for which the circuit carrier 2 is kept in the heated state, may be at least 15 minutes, at least 30 minutes, or even at least 60 minutes. At the beginning of the heated state, the first mass 61 may be paste-like, and, subsequently, be cured. The first mass 61 may reach its cured state within that duration. The cured fist mass substantially prevents a bending-back of the circuit carrier 2 even when the temperature of the circuit carrier 2 subsequently is reduced. If the first mass 61 is an adhesive, a first adhesive connection between the lid 50 (e.g. between the plunger 55) and the substrate assembly 1 is formed by curing the cured first mass 61.

In the initial state, all over the circuit carrier (i.e. everywhere on and in the circuit carrier 2), the temperature is less than or equal to an initial temperature $T2_0$ lower than the first temperature $T2_1$. For instance, the initial temperature $T2_0$ may be, without being restricted to, room temperature, e.g. 25° C., and the first temperature $T2_1$ may be significantly higher than room temperature, e.g., without being restricted to, 100° C., or 125° C., or 150° C., or even 175° C. Alternatively or additionally, a difference between the first temperature T21 and the initial temperature $T2_0$ may be at least 75° C.

Summarizing the above, FIG. 3A illustrates the described initial state, in which, all over the circuit carrier 2, the temperature is less than or equal to an initial temperature $T2_0$ lower than the first temperature $T2_1$. In the initial state, the first mass 61 is uncured (i.e. has not yet reached its cured state), and the second mass 62 is uncured, and the surface 2b may be plane or substantially plane. However, the surface 2b might also be slightly concave, or even slightly convex. The first mass 61 may reach its cured state simultaneously with or after the second mass 62 reaches its cured state. The cured state of the second mass 62 is reached as soon as the second mass 62 everywhere has a modulus of elasticity of at least 0.1 MPa. In the heated and, optionally, also the cooled state of the circuit carrier 2, the circuit carrier 2 may, over the whole heat exchange surface 2b or at least in a region of the heat exchange surface 2b opposite the cured first mass 61, be convex.

As illustrated in FIG. 3A, the uncured first mass 61 extends (at least) between the lid 50 (e.g. between the plunger 55) and the substrate assembly 1. When the circuit carrier 2 is heated from the initial state (FIG. 3A) to the heated state (FIG. 3B), the circuit carrier 2 bends due to the temperature rise. Therefore, the distance between the lid 50 (e.g. between the plunger 55) and the circuit carrier 2 changes. The bending of the circuit carrier 2 may take place such that the distance between the lid (e.g. between the plunger 55) and the circuit carrier 2 in the heated state is larger than in the initial state.

In the heated state of the circuit carrier 2, the first mass 61 is cured so that the (enlarged) distance between the lid 50 (e.g. the plunger 55) and the circuit carrier 2 is substantially fixed (apart from a possible elastic deformation of the cured mass 61).

The second mass 62, which is an adhesive, is also cured. Thereby, a (second) adhesive connection is formed between the module housing 5 and the circuit carrier 2. That is, the cured second mass 62 connects the module housing 5 and the circuit carrier 2. In both the uncured and the cured state, the second mass 62 extends (at least) between the module housing 5 and the substrate assembly 1, e.g. (at least) between the module housing 5 and the circuit carrier 2. Optionally, the uncured and the cured second mass 62 may be ring-shaped and seal a ring-shaped gap between the module housing 5 and the circuit carrier 2. The second mass 62 may reach its cured state prior to or simultaneously with the first mass 61.

When the second mass 62 reaches its cured state before the first mass 61 reaches its cured state, for instance, when the second mass 62 reaches its cured state when the circuit carrier 2 is still in its initial state (i.e. when all over the circuit carrier 2 the temperature is less than or equal to the initial temperature $T2_0$) or when the circuit carrier 2 is between its initial state and its heated state (i.e. when there is at least one location on or inside the circuit carrier 2 that has a temperature of more than the initial temperature $T2_0$ and less than the first temperature $T2_1$), the uncured first mass 61 is, to a certain degree, viscous and may be thixotropic so that it does not, on the one hand, flow off and, on the other hand, can follow the bending of the circuit carrier 2 in that it extends, at all times between the initial state of the circuit carrier 2 and the time at which the first mass 61 reaches its cured state (in particular at all times between the initial state of the circuit carrier 2 and the time at which the second mass 62 reaches its cured state), between the plunger 55 (e.g. between the end 551) and the substrate assembly 1 (e.g. the circuit carrier 2). Figuratively speaking, the first mass 61 "follows" the bending of the circuit carrier 2 so that the first mass 61 bridges the gap between the lid 50 (e.g. between the plunger 55) and the substrate assembly 1 at all times.

Figure 3D:
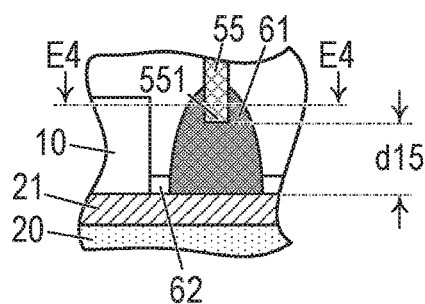

After the first mass 61 has reached its cured state (i.e. after the (enlarged) distance between the lid 50 (e.g. between the plunger 55) and the circuit carrier 2 has been substantially fixed), and after the second mass 62 has reached its cured state (i.e. after the module housing 5 and the circuit carrier 2 have been joined by the cured second mass 62), the substrate assembly 1, the module housing 5, the cured first mass 61 and the cured second mass 62 become constituents of an electronic module assembly 100, and the circuit carrier 2 may be cooled down so that everywhere on and in the circuit carrier 2 the temperature is less than or equal to a second temperature $T2_2$ that is lower than the first temperature $T2_1$. This state is illustrated in FIG. 3C. An enlarged section of the electronic module assembly 100 of FIG. 3C is illustrated in FIG. 3D. According to one option, the difference between the second temperature $T2_2$ and the first temperature $T2_1$ may be, without being restricted to, at least 75° C. According to one option, the second temperature $T2_2$ may be less than or equal to 25° C.

The cooled down circuit carrier 2 substantially keeps its bent shape because the cured first mass 61 prevents (apart from an elastic deformation of the cured first mass 61) a reduction of the distance d15 (see FIG. 3D) between the lid 50 (e.g. between the plunger 55) and the substrate assembly 1, and because the module housing 5 is significantly stiffer than the circuit carrier 2. In the cured state of the first mass 61, the distance d15 between the lid 50 (e.g. between the plunger 55) and the substrate assembly 1 may be, without being restricted to, less than 0.5 mm.

Figure 3E:
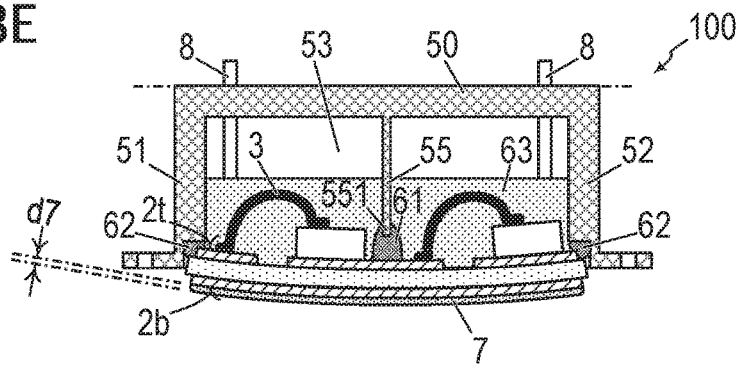

As further illustrated in FIG. 3E, a dielectric potting 63, for instance a gel (e.g. a silicone gel) may be disposed inside the module housing 5. The potting 63 may adjoin the circuit carrier 2, the side wall 51, 52, 53, 54, the second mass 62, and, optionally, also the first mass 61. Optionally, the potting 63 may cover the semiconductor chip 10 and, if provided, the bonding wire 3.

Also illustrated in FIG. 3E is a layer 7 of a thermal interface material that may be produced on a heat exchange surface 2b of the circuit carrier 2 which may be a surface 2b of the circuit carrier 2 facing away from the lid 50 and, if the module housing 5 has a plunger 55, from the plunger 55. That is, the circuit carrier 2 is disposed between the plunger 55 and the layer 7 of a thermal interface material. Instead of this, it would also be possible to produce the layer 7 of the thermal interface material on the heat sink 200. In both cases, the thermal interface material may have, at a temperature of 25° C. and without being restricted to, a thermal conductivity in the range from 0.4 W/(m·K) to 1 W/(m·K).

If the layer 7 applied to the heat exchange surface 2b of the circuit carrier 2 or to the heat sink 200 is a continuous layer it may have, without being restricted to, a layer thickness d7 of less than or equal to 30 µm so that the down force F required for letting creep a little of the thermal interface material laterally out of the gap between the heat exchange surface 2b and the heat sink 200 is very low. For the same reason, if the layer 7 applied to the heat exchange surface of the circuit carrier 2 or to the heat sink 200 includes a plurality of single dots spaced distant from one another, the layer thickness d7 may be, without being restricted to, less than or equal to 120 µm. Thereby, the footprint area of each single dot may be less than or equal to 10 mm². Optionally, the total amount of the thermal interface material may be chosen such that an average thickness of the layer 7 is less than or equal to 30 µm.

Figure 3F:
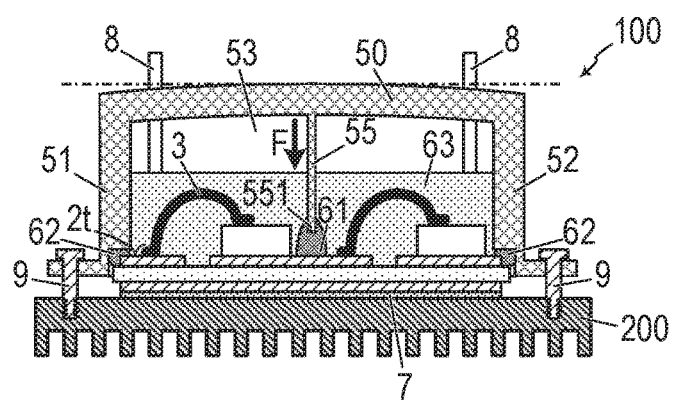

Subsequently, the module housing 5 and a heat sink 200 may be joined so that the layer 7 of the thermal interface material adjoins both the circuit carrier 2 (i.e. the heat exchange surface 2b) and the heat sink 200, and so that the circuit carrier 2 is pressed against the heat sink 200. The result is illustrated in FIG. 3F. In the example of FIG. 3F, the module housing 5 and the heat sink 200 are joined by screws 9. However, any other joining technique, e.g. clamping, riveting, may be used as well. When joining the module housing 5 and the heat sink 200, the circuit carrier 2 is pressed against the heat sink 200 so that the bending of the circuit carrier 2 is reduced. Thereby, the module housing 5 is pre-tensioned, which causes the lid 50 (e.g. the plunger 55) to locally press the substrate assembly 1 indirectly (i.e. via the cured first mass 61) against the heat sink 200. This pressing counteracts the formation of air gaps or other gas-filled spaces between the circuit carrier 2 (i.e. between the heat exchange surface 2b) and the heat sink 200 when the circuit carrier 2 is heated during the operation of the electronic module 100 by the heat produced from the electronic components 10 of the substrate assembly 1. In FIG. 3F, the downforce F caused by the pretension of the module housing 5 is schematically indicated by a bold arrow. In this connection it is to be noted that heating the circuit carrier 2 causes the circuit carrier 2 to bend towards the lid 50 (e.g. towards the plunger 55) and away from the heat sink 200 because the edges of the circuit carrier 2 are clamped by the module housing 5 when this is joined with the heat sink 200 so that the only direction the heated and thereby enlarged circuit carrier 2 can sufficiently bend in is away from the heat sink 200.

Figure 4:
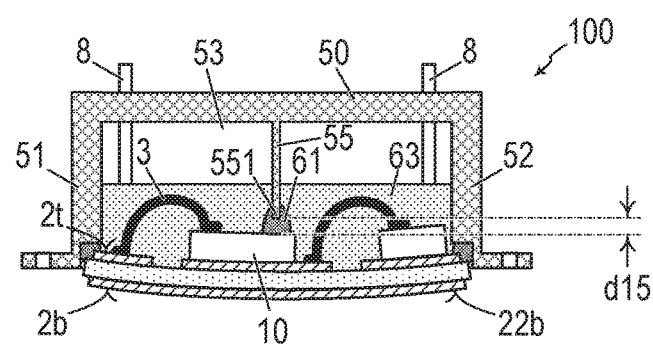
FIG. 4 illustrates an electronic module assembly in which the plunger is adhered to a semiconductor chip.
Figure 5:
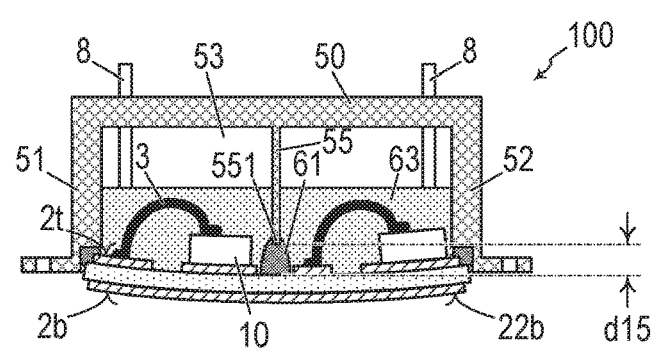
FIG. 5 illustrates an electronic module assembly in which the plunger is adhered to an insulation carrier of the circuit carrier.

In the previous example, the uncured and cured first mass 61 was described to adjoin the substrate assembly 1 at the circuit carrier 2, e.g. the first metallization layer 21. However, the principles, methods, designs, dimensions, options, materials etc. of the examples explained above also apply if the uncured and cured first mass 61 adjoins the substrate assembly 1 at the semiconductor chip 10 (see FIG. 4), at the insulation carrier 20 (see FIG. 5) or at a bonding wire 3 (e.g. at a region of a maximum loop height of the bonding wire 3) (see FIG. 6), or at any other constituent part of the substrate assembly 1.

As further illustrated in FIG. 7, a module housing 5 may include two or more plungers 55, and between each of the plungers 55 and the substrate assembly 1 a curable first mass 61 may be placed and subsequently cured as described above. If the first mass 61 is an adhesive, the cured first mass 61 forms a substance-to-substance bond between the respective plunger 55 and the substrate assembly 1. The different uncured and cured first masses 61 may optionally be disposed distant from one another and/or, also optionally, distant from both the uncured and cured second mass 62.

In an example electronic module assembly 100, a circuit carrier 2 having edge lengths of about 50 mm×50 mm, an insulation carrier 20 of $Al_2O_3$, a first substrate metallization layer 21 and a second substrate metallization layer 22. of copper were used. The layer thickness d20 of the insulation carrier 20 was 0.38 mm, and each of the layer thicknesses d21 and d22 of substrate metallization layers 21, 22 was 0.3 mm. The required downforce F was between 5 N and 10 N, the distance d15 was about 0.1 mm, the plunger was a straight pin and had a cross section of about 5 $mm^2$, and the modulus of elasticity of the cured first mass 61 was, at a temperature of 25° C., about 20 MPa.

As will be explained by way of example with reference to FIG. 8, the uncured and cured first mass 61 does not necessarily need to be disposed between the substrate assembly 1 and a plunger 55. Instead, the uncured first mass 61 may be applied between the substrate assembly 1 and a section 501 of the lid 50 where the lid 50 has no plunger, and then be cured so that the cured first mass 61 is disposed between the substrate assembly 1 (e.g. between a bonding wire 3 of the substrate assembly 1) and the plunger-free section 501 of the lid 50. For instance, the cured first mass 61 may extend between the cured first mass 61 and the substrate assembly 1 (e.g. a bonding wire 3). Apart from the fact that there is no plunger in the section 501, the principles, methods, designs, dimensions, options, materials etc. of the examples explained above also apply.

Figure 6:
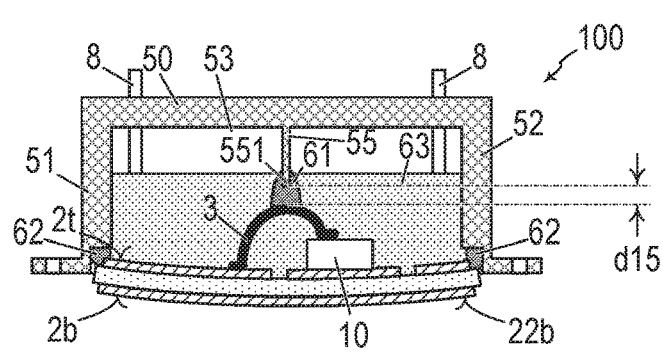
FIG. 6 illustrates an electronic module assembly in which the plunger is adhered to a bonding wire of the substrate assembly.
Figure 7:
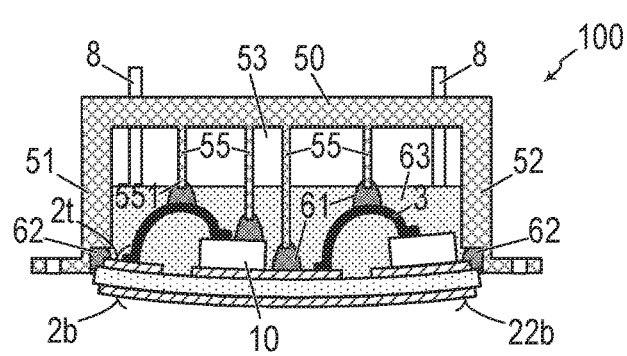
FIG. 7 illustrates an electronic module assembly with several plungers each adhered to a constituent part of the substrate assembly.
Figure 8:
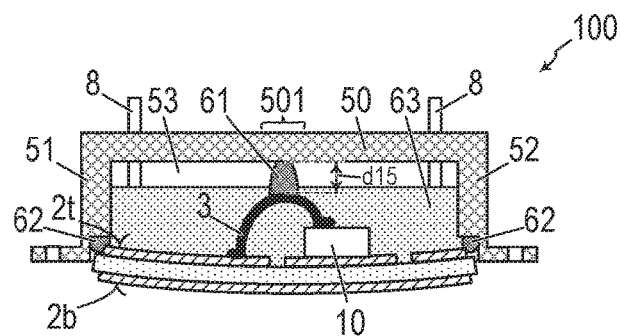
FIG. 8 illustrates an electronic module assembly in which the cured first mass is disposed between the substrate assembly and a plunger-free section of the module housing.

If a dielectric potting 63, for instance a gel (e.g. a silicone gel) is disposed inside the module housing 5 and if the first mass 61 extends between a bonding wire 3 and the lid 50 (e.g. between a bonding wire 3 and the plunger 55 or the end 551), the bonding wire 3 may be completely embedded in the potting 63 as illustrated in FIGS. 6, 7 and 8. Alternatively, the bonding wire 3 may protrude from the potting 63, and the first mass 61 may extend between the protruding part of the bonding wire 3 and the lid 50.

Figure 9A:
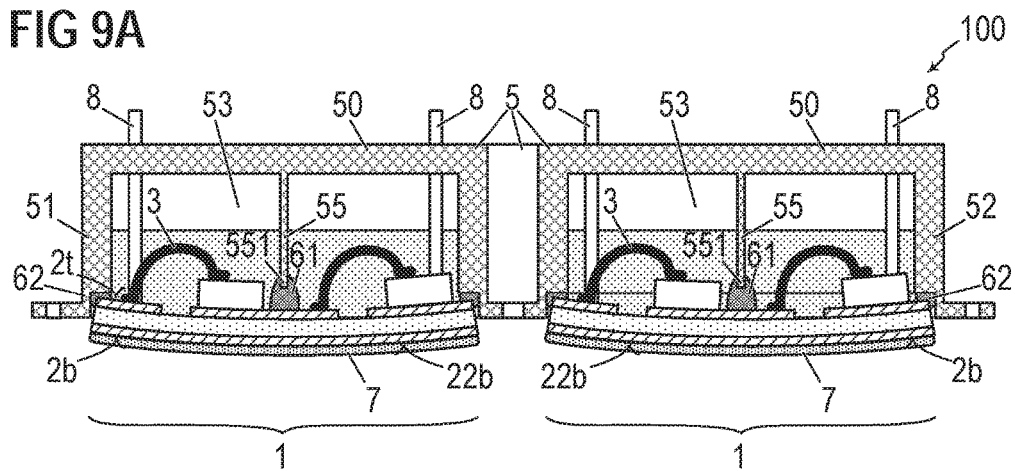
FIG. 9A illustrates an electronic module assembly that includes at least two separate substrate assemblies disposed distant from one another.

As further illustrated in FIG. 9A, an electronic module 100 may include two or more separate substrate assemblies 1 disposed distant from one another. Each of the substrate assemblies 1 may, irrespective of the structure of the other substrate assemblies 1, have the properties of any of the substrate assemblies 1 explained above and be attached to the module housing 5 using curable first and second masses 61, 62 as explained above. According to one example illustrated in FIG. 9A, for each of the substrate assemblies 1, the module housing 5 may have at least one plunger 55, and a curable first mass 61 may be disposed between that plunger 55 and the respective substrate assembly I. According to another example (not shown), for each of at least one of the substrate assemblies 1, the module housing 5 may have at least one plunger 55, and a curable first mass 61 may be disposed between that plunger 55 and the respective substrate assembly 1 (as explained with reference to FIGS. 1 to 7), and for each of at least one further substrate assembly 1, a curable first mass 61 may be disposed between a plunger-free section 501 of the module housing 5 and the respective substrate assembly 1 (as explained with reference to FIG. 8). According to still a further example (not shown), for each of the substrate assemblies 1, a curable first mass 61 may be disposed between a plunger-free section 501 of the module housing 5 and the respective substrate assembly 1 (as explained with reference to FIG. 8).

Figure 9B:
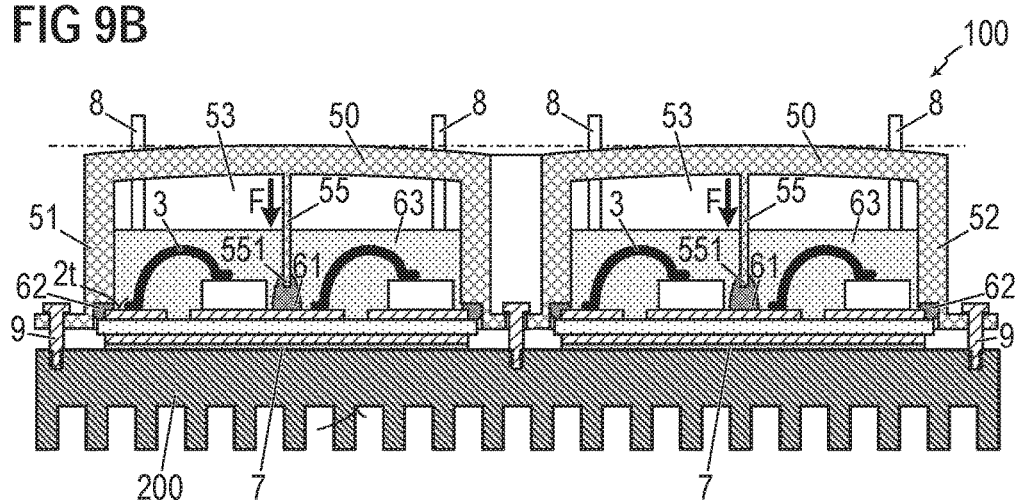
FIG. 9B illustrates the electronic module assembly of FIG. 9A attached to a heat sink.

As also illustrated in FIG. 9A, each of the substrate assemblies 1 may include a circuit carrier 2 having a heat exchange surface 2b. On each of the heat exchange surfaces 2b, a layer 7 of a thermal interface material having the properties explained with reference to FIG. 3E has been produced. The electronic module 100 with layers 7 of the thermal interface material applied to the heat exchange surfaces 2b may be joined with a heat sink 200 as explained in more detail with reference to FIG. 3F. Instead of this, it would also be possible to produce the layers 7 (or one continuous layer 7) of the thermal interface material on the heat sink 200. By joining the module housing 5 and the heat sink 200, the circuit carriers 2 are pressed against the heat sink 200 so that the bending of the circuit carriers 2 is reduced. Thereby, the module housing 5 is pre-tensioned which causes the lid 50 (e.g. the plungers 55) to locally press the substrate assemblies 1 indirectly (i.e. via the respective cured first mass 61) against the heat sink 200. In FIG. 9B, the downforces F caused by the pretension of the module housing 5 are schematically indicated by bold arrows.

Irrespective of whether the electronic module 100 includes just one or at least two substrate assemblies 1, a downforce F caused by a pre-tension of the module housing 5 is transmitted from the module housing 5 (e.g. from the lid 50, e.g. from a plunger 55 or a plunger-free section 501) via a cured first mass 61. In order to effectively press the respective substrate assembly 1 (i.e. the circuit carrier 2 thereof) against the heat sink 200, the cured first mass 61 may have a high modulus of elasticity which may be higher than the moduli of elasticity of many adhesives used in conventional electronic modules for joining a circuit carrier and a module housing. For instance, the cured first mass 61 may, without being restricted to, everywhere comprise, at a temperature of 25° C., a modulus of elasticity of at least 1 MPa or even of at least 15 MPa.

In order to prevent large relative movements between the substrate assembly 1 and the module housing 5, the cured second mass 62 may, without being restricted to, everywhere comprise, at a temperature of 25° C., a modulus of elasticity of at least 0.1 MPa. Optionally, both the cured first mass 61 and the cured second mass 62 may everywhere comprise, at a temperature of 25° C., the same modulus of elasticity, e.g. at least 1 MPa. Such identical moduli of elasticity can easily by achieved by producing the cured first and second masses 61, 62 from the same type of curable mass.

Figure 10:
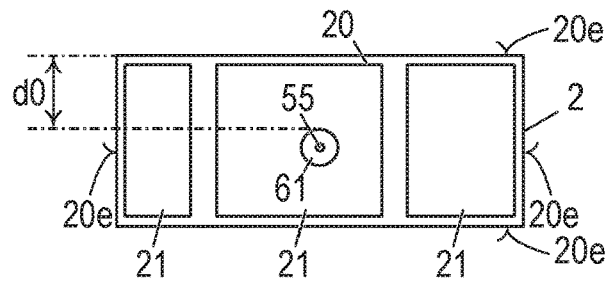
FIG. 10 is a cross-sectional top view of the electronic module assembly of FIG. 3C illustrating just the circuit carrier, the cured first mass and the plunger.

In order to effectively press the respective substrate assembly 1 (i.e. the circuit carrier 2 thereof) against the heat sink 200, the cured first mass 61 may be disposed distant from each edge of the insulation carrier 20 of the circuit carrier 2 of the substrate assembly 1. FIG. 10 is a cross-sectional top view of the electronic module 100 of FIG. 3C illustrating just the circuit carrier 2, the cured first mass 61 and the plunger 55. For the sake of clarity, the other parts of the electronic module 100 are omitted. As shown, the insulation carrier 20 of the circuit carrier 2 has a number of edges 20e. The shortest among all distances between the cured first mass 61 and all edges 20e is designated with d0. For instance, the shortest distance d0 may be, without being restricted to, 10 mm.

Figure 11:
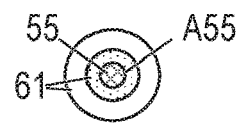
FIG. 11 is a cross-sectional top view of the plunger and the cured first mass illustrated in FIG. 3D with the cross-section taken in a cross-sectional plane E4-E4.

As already explained above, FIG. 3D illustrates an enlarged section of an electronic module 100 according to FIG. 3C that includes a module housing with a lid having a plunger 55, shown after cooling down the circuit carrier 2 from the heated state to the cooled-down state, so that everywhere on and in the circuit carrier 2 the temperature is less than or equal to the second temperature $T2_2$. A part of the plunger 55 is embedded in the cured first mass 61. As illustrated in FIG. 3C, there is no layer 7 of a thermal interface material applied to the surface 2b (as in FIG. 3E), and the electronic module 100 is not mounted to a heat sink 200 (as in FIG. 3F). That is, the surface 2b is exposed. In this cooled-down state, the module housing 5 is, as described above, pre-tensioned and causes a downforce F. FIG. 11 is a cross-sectional top view showing just the plunger 55 and the cured first mass 61 with the cross-section being taken in a cross-sectional plane E4-E4 shown in FIG. 3D. The cross-sectional plane E4-E4 intersects both the plunger 55 and the cured first mass 61 perpendicularly to the direction of the downforce F and is taken such that in the cross-sectional plane E4-E4, the cured first mass 61 surrounds the plunger 55 and adjoins the entire circumference of the plunger 55. In the cross-sectional plane E4-E4, the cross-sectional area of the plunger 55 is A55.

The modulus of elasticity of the cured first mass 61 is sufficiently high to generate a proper downforce F and to prevent the surface 2b of the cooled-down circuit carrier 2 adhered to the module housing 5 (see FIG. 3C) from being concave. A concave surface 2b is undesired because it would cause an accumulation of the thermal interface material when the electronic module 100 provided with the layer 7 of the thermal interface material is mounted on the heat sink 200. On the contrary, when an electronic module 100 with a circuit carrier 2 having a convex surface 2b and a layer 7 of thermal interface material applied to the convex surface 2b is mounted onto a heat sink 200, a little of the thermal interface material can easily squeezed out of the gap between the heat exchange surface 2b and the heat sink 200 so that the layer 7 becomes thin and, therefore, has a low thermal resistance.

Figure 12:
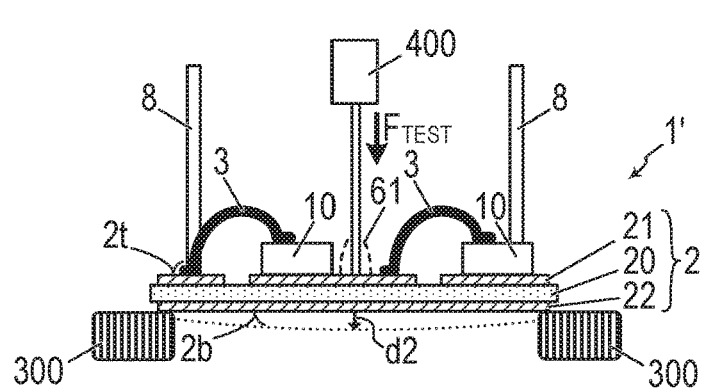
FIG. 12 illustrates a measuring arrangement for estimating parameters of an electronic module assembly to be produced.

For a straight plunger 55, a method for estimating a proper downforce F is, as illustrated in FIG. 12, to take a sample 1' of the substrate assembly 1 (i.e. an identical copy thereof) to be used in the electronic module 100. In each of at least one temperature cycle, the sample substrate assembly 1' is heated to the heated state and subsequently cooled down to the cooled state as described above because it has been shown that, after such temperature cycling, the reproducibility of the thermomechanical behavior of a substrate assembly 1, 1' is significantly improved. After the temperature cycling and in the cooled state, the border of circuit carrier 2 is, as illustrated in the measuring arrangement of FIG. 12, supported at its border by a stable support 300. Subsequently, the circuit carrier 2 resting on the support 300 is deflected by locally pressing against the sample substrate assembly 1' so that the position of the force effect is shifted by a pre-defined distance d2, e.g. 10 µm or 30 µm, and the circuit carrier 2 becomes convex or more convex at the surface 2b. The local pressing against the sample substrate assembly 1' takes place at the corresponding position at which the first mass 61 (illustrated in dashed fashion) is to be placed in the electronic module 100 to be produced. In FIG. 12, the dotted line illustrates the run of the surface 2b when the desired pre-defined distance d2 is reached. A force measuring device 400 is used to measure a force $F_{TEST}$ required to achieve the desired pre-defined distance d2. The force $F_{TEST}$ is taken as the desired (target) down force F explained with reference to FIG. 3F.

The cross-sectional area A55 of the plunger 55, the distance d15 (see FIG. 3D) in the cooled down state, the modulus of elasticity E61 of the cured first mass 61 are chosen to fulfill the following equation:

$$F_{TEST} = A55 \cdot E61 \cdot (d2/d15).$$

Despite the fact that the method for estimating a proper downforce F was explained with reference to the example electronic module 100 of FIG. 3C, the method also may be used in connection with all other electronic modules 100 in which a cured first mass 61 is (at least) disposed between a substrate assembly 1 and a straight plunger 55. The local pressing against the sample substrate assembly 1' takes place at the corresponding position at which the first mass 61 is to be placed on the substrate assembly 1 of the electronic module 100 to be produced, e.g. at the first substrate metallization layer 21 (FIG. 3C), at a semiconductor chip 10 (FIG. 4), at the insulation carrier 20 (FIG. 5), or at a bonding wire 3 (FIG. 6).

Figure 13:
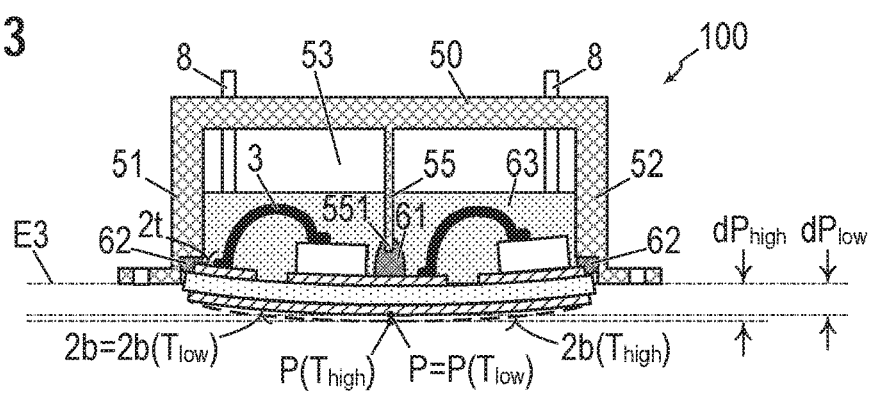
FIG. 13 illustrates how the distance between a tangential plane of the module housing and a point of the heat transfer surface of the electronic module assembly located opposite the cured first mass may change with the temperature of the electronic module assembly.

In FIG. 13, the shapes the heat exchange surface 2b of an electronic module assembly 100 takes at two different temperatures of the electronic module assembly 100 are illustrated. The shape the heat exchange surface takes when the electronic module assembly 100 everywhere has a low temperature $T_{low}$ is designated with 2b ($T_{low}$), and the shape the heat exchange surface takes when the electronic module assembly 100 everywhere has a high temperature $T_{high}$ higher than the low temperature $T_{low}$ is designated with 2b ($T_{high}$) and illustrated in dashed fashion. As can be seen by comparing these shapes, the curvature of the heat exchange surface (2b ($T_{high}$)) at he high temperature $T_{high}$ of the electronic module assembly 100 is greater than the curvature of the heat exchange surface (2b ($T_{low}$)) at the low temperature $T_{low}$. Therefore, a distance between a point P of the heat exchange surface 2b opposite the cured first mass 61 and a tangent plane E3-E3 of the module housing 5 may depend on the temperature of the electronic module assembly 100. As illustrated in FIG. 13 which shows the electronic module assembly 100 at the low temperature $T_{low}$, a point P of the heat exchange surface 2b is located opposite the cured first mass 61 (and, if there is a plunger 55, opposite the plunger 55 or the opposite the end 551) at a position $P_{low}$. The distance between this point P and the tangential plane E3-E3 at the low temperature $T_{low}$ of the electronic module assembly 100 is designated with $dP_{low}$, and the distance between this point P (i.e. between the position $P_{high}$ of the point P)

and the tangential plane E3-E3 at the high temperature $T_{high}$ of the electronic module assembly 100 is designated with $dP_{high}$. As also illustrated in FIG. 13, the distances $dP_{high}$ and $dP_{low}$ differ from one another. For instance, if the high temperature $T_{high}$ is at least the first temperature $T2_1$ (i.e. the minimum temperature the circuit carrier 2 has in its heated state) and the low temperature $T_{low}$ is less than or equal to the second temperature T22 (i.e. the maximum temperature the circuit carrier 2 has in its cooled state), the absolute value of the difference between the distances $dP_{high}$ and $dP_{low}$ may be, without being restricted to, at least 10 µm. Optionally, the distance $dP_{high}$ may be greater than the distance $dP_{low}$. The tangent plane E3-E3 may be a (virtual) plane abutting the side of the module housing 5 to which the circuit carrier 2 mounted.

Figure 14:
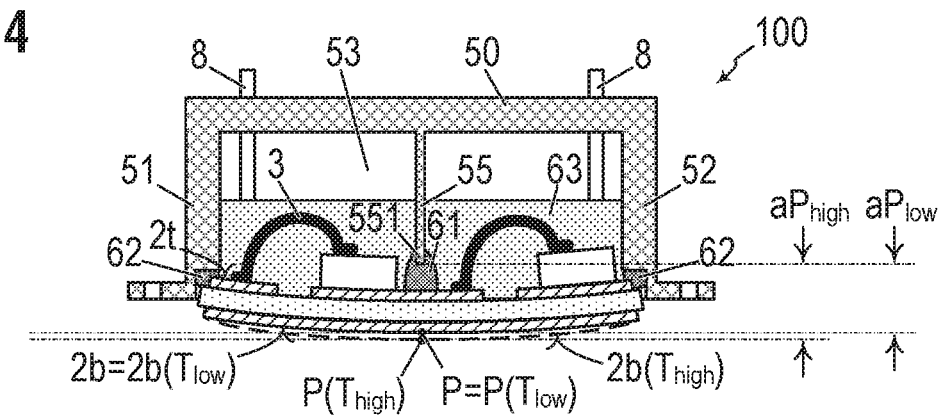
FIG. 14 illustrates how the distance between the lid of the module housing and a point of the heat transfer surface of the electronic module assembly located opposite the cured first mass may change with the temperature of the electronic module assembly.

Alternatively or additionally, a distance between such a point P and the lid 50 (if there is a plunger 55, the distance may be the distance between the point P and the plunger 55 or the end 551) may change with the temperature of the electronic module assembly 100. This is, analogously to FIG. 13, illustrated in FIG. 14. As shown in FIG. 14, the distance between the point P and the lid 50 (which in the example of FIG. 14 is the distance between the point P and the plunger 55 or the end 551) at the low temperature $T_{low}$ of the electronic module assembly 100 is designated with $aP_{low}$, and the distance between this point P and the lid 50 at the high temperature $T_{high}$ of the electronic module assembly 100 is designated with $aP_{high}$. As also illustrated in FIG. 14, the distances $aP_{high}$ and $aP_{low}$ differ from one another. For instance, if the high temperature $T_{high}$ is at least the first temperature $T2_1$ (i.e. the minimum temperature the circuit carrier 2 has in its heated state) and the low temperature $T_{low}$ is less than or equal to the second temperature T22 (i.e. the maximum temperature the circuit carrier 2 has in its cooled state), the difference $aP_{high}-aP_{low}$ between the distances $aP_{high}$ and $aP_{low}$ may be, without being restricted to, at least 10 µm. Thereby, the distance $dP_{high}$ is greater than the distance $dP_{low}$.

If the electronic module assembly 100 is, e.g. in its cooled state, mounted to a plane surface of a heat sink 200 as described with reference to FIGS. 3F and 9B, the module housing 5 (e.g. the plunger 55 or the end 551) exerts a force F on the circuit carrier 2 so that the cured first mass 61 is compressed. The compression can be expressed in terms of a change $\Delta d15$ of the distance d15 (see FIG. 3D) between a state in which the electronic module assembly 100 is in the unmounted state (i.e. when the electronic module assembly 100 is not mounted to a heat sink or the like so that the bending of the circuit carrier 2 is not limited by external elements) and a state in which the electronic module assembly 100 is in a mounted state (i.e. when the electronic module assembly 100 is mounted to a plane surface of a heat sink). For instance, if the electronic module assembly 100 is in an unmounted state and has an overall temperature of less than or equal to the second temperature $T2_2$, the distance d15 is as explained with reference to FIG. 3D. If the electronic module assembly 100 is mounted to a plane surface of a heat sink 200 as explained with reference to FIGS. 3F and 9B and the same overall temperature of less than or equal to the second temperature $T2_2$, the cured first mass 61 is compressed by the force F and the distance d15 is reduced to $d15_{red}$. That is, $\Delta d15=d15-d15_{red}$. In order to calculate or at least estimate the required parameters, the following relation may be used:

$$F = A55 \cdot E61 \cdot (\Delta d15/d15).$$

Thereby, A55 is the cross-sectional area of the plunger 55 as explained with reference to FIG. 11, and E61 is the modulus of elasticity E61 of the cured first mass 61.

According to one example, for a cylindrical plunger 55 having a diameter of 2.5 mm (i.e. the cross-sectional area A55 is about 4.9 mm$^2$), a modulus of elasticity E61 of the cured first mass 61 of 20 MPa, an initial distance d15 of 100 µm, and a change $\Delta d15$ of the distance d15 of 10 µm, the resulting force F is about 9.8 N.

According to a further example, for a cylindrical plunger 55 having a diameter of 3.0 mm (i.e. the cross-sectional area A55 is about 7.1 mm$^2$), a modulus of elasticity E61 of the cured first mass 61 of 1 MPa, an initial distance d15 of 100 µm, and a change $\Delta d15$ of the distance d15 of 20 µm, the resulting force F is about 5.7 N.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing an electronic module assembly, the method comprising:
    curing a curable first mass extending between a substrate assembly and a module housing while a circuit carrier of the substrate assembly has a temperature of at least a first temperature;
    forming an adhesive connection between a side wall of the module housing and the substrate assembly by curing a curable second mass; and
    cooling down the circuit carrier subsequent to curing the first mass to below a second temperature lower than the first temperature,
    wherein the electronic module is produced such that the circuit carrier comprises a heat exchange surface facing away from the cured first mass, wherein a point of the heat exchange surface opposite the cured first mass comprises, when the electronic module assembly is heated to at least the first temperature, a first distance from a lid of the module housing, wherein the point of the heat exchange surface comprises, when the electronic module assembly is cooled to less than or equal to the second temperature, a second distance from the lid of the module housing, and wherein a difference between the first distance and the second distance is at least 10 µm.

2. The method of claim 1, wherein curing the first mass, forming the adhesive connection and cooling the circuit carrier is carried out such that at least one of: the cured first mass everywhere comprises a modulus of elasticity of at least 1 MPa; and the cured second mass everywhere comprises a modulus of elasticity of at least 0.1 MPa.

3. The method of claim 1, wherein curing the first mass, forming the adhesive connection and cooling the circuit carrier is carried out such that both the cured first mass and the cured second mass everywhere comprise a modulus of elasticity of at least 1 MPa.

4. The method of claim 1, wherein the module housing comprises a plunger disposed between and distant from both a first segment and a second segment of the side wall.

5. The method of claim 4, wherein the plunger comprises a free end, and wherein curing the first mass, forming the adhesive connection and cooling the circuit carrier is carried out such that the cured first mass adjoins both the free end and the substrate assembly.

6. The method of claim 1, wherein curing the first mass, forming the adhesive connection and cooling the circuit carrier is carried out such that in the cured state of the first mass, a distance between a lid of the module housing and the substrate assembly is less than 0.5 mm.

7. The method of claim 1, wherein curing the first mass, forming the adhesive connection and cooling the circuit carrier is carried out such that the cured first mass adjoins at least one of: the circuit carrier; a bonding wire of the substrate assembly; and a semiconductor chip of the substrate assembly.

8. The method of claim 1, wherein at least one of: the first temperature is at least 100° C.; and the second temperature is less than or equal to 25° C.

9. The method of claim 1, wherein a difference between the second temperature and the first temperature is at least 75° C.

10. The method of claim 1, wherein the circuit carrier comprises a dielectric insulation carrier and a first metallization layer attached to the dielectric insulation carrier.

11. The method of claim 1, further comprising:
disposing a dielectric gel inside the module housing, the dielectric gel adjoining the circuit carrier, the side wall and at least one of the first mass and the second mass.

12. The method of claim 1, further comprising:
producing a layer of a thermal interface material on the circuit carrier; and
joining the module housing and a heat sink so that the layer of the thermal interface material adjoins both the circuit carrier and the heat sink and so that the circuit carrier is pressed against the heat sink.

13. A method for producing an electronic module assembly, the method comprising:
introducing a curable first mass between a substrate assembly and a module housing so that the curable first mass extends from a free end of a plunger of the module housing to a component of the substrate assembly, the plunger being spaced inward from a side wall of the housing;
introducing a curable second mass between the side wall of the module housing and the substrate assembly so that the curable second mass extends from the side wall to a circuit carrier of the substrate assembly and is disposed distant from the curable first mass;
heating the circuit carrier to a heated state so that the circuit carrier is in the heated state at least at that moment at which the curable first mass reaches a cured state, the circuit carrier bending in the heated state so that a gap between the plunger and the component of the substrate assembly increases, the curable first mass bridging the gap between the plunger and the component of the substrate assembly during the heating of the circuit carrier;
curing the curable second mass; and
in the heated state of the circuit carrier, curing the curable first mass so that the gap between the plunger and the circuit carrier is substantially fixed and the circuit carrier keeps a bent shape after being cooled down.

14. The method of claim 13, wherein the curable first mass is applied to the substrate assembly prior to placing the module housing onto the substrate assembly.

15. The method of claim 13, wherein the curable first and second masses cure substantially at the same time.

16. The method of claim 13, wherein the curable second mass cures prior to curing of the curable first mass.

17. The method of claim 13, wherein the curable second mass is ring-shaped and seals a ring-shaped gap between the module housing and the circuit carrier in a cured state.

18. The method of claim 13, further comprising:
after the substrate assembly, the module housing, the cured first mass and the cured second mass become constituents of an electronic module assembly, cooling down the circuit carrier.

19. The method of claim 13, further comprising:
applying a layer of thermal interface material to a surface of the circuit carrier having the bent shape; and
joining the module housing and a heat sink so that the layer of thermal interface material adjoins the circuit carrier to the heat sink and so that the circuit carrier is pressed against the heat sink, the pressing of the circuit carrier against the heat sink reducing the bending of the circuit carrier and causing the plunger to locally press the substrate assembly against the heat sink.

* * * * *